(12) United States Patent
Kim

(10) Patent No.: US 7,491,993 B2
(45) Date of Patent: Feb. 17, 2009

(54) CMOS IMAGE SENSOR AND METHOD FOR MANUFACTURING THE SAME

(75) Inventor: Shang Won Kim, Chungcheongbuk-do (KR)

(73) Assignee: Dongbu Electronics Inc., Seoul (KR)

( * ) Notice: Subject to any disclaimer, the term of this patent is extended or adjusted under 35 U.S.C. 154(b) by 164 days.

(21) Appl. No.: 11/315,627

(22) Filed: Dec. 23, 2005

(65) Prior Publication Data

US 2006/0138498 A1 Jun. 29, 2006

(30) Foreign Application Priority Data

Dec. 24, 2004 (KR) .................. 10-2004-0112028

(51) Int. Cl.
*H01L 31/062* (2006.01)
*H01L 31/113* (2006.01)

(52) U.S. Cl. .................. 257/294; 257/69; 257/432; 438/65; 438/66; 438/113; 438/460; 438/464

(58) Field of Classification Search .................. 257/69, 257/98, 294, 432; 438/65, 66, 113, 460, 438/464
See application file for complete search history.

(56) References Cited

U.S. PATENT DOCUMENTS

| | | | | |
|---|---|---|---|---|
| 6,271,103 | B1 * | 8/2001 | Lee | 438/464 |
| 6,661,046 | B2 * | 12/2003 | Kim | 257/292 |
| 6,821,810 | B1 * | 11/2004 | Hsiao et al. | 438/69 |
| 6,831,311 | B2 | 12/2004 | Uchida | |
| 7,078,260 | B2 * | 7/2006 | Jeon | 438/65 |
| 7,166,489 | B2 * | 1/2007 | Kim | 438/60 |
| 7,227,692 | B2 * | 6/2007 | Li et al. | 359/619 |
| 2002/0079504 | A1 * | 6/2002 | Kim | 257/98 |
| 2004/0130794 | A1 * | 7/2004 | Houlihan et al. | 359/626 |
| 2005/0128596 | A1 * | 6/2005 | Li et al. | 359/619 |
| 2005/0139832 | A1 * | 6/2005 | Jeon | 257/69 |
| 2005/0242271 | A1 * | 11/2005 | Weng et al. | 250/214.1 |

FOREIGN PATENT DOCUMENTS

| | | |
|---|---|---|
| JP | 2003-204050 | 7/2003 |
| KR | 10-2004-0059760 | 7/2004 |
| KR | 1020040059760 A | 7/2004 |

* cited by examiner

*Primary Examiner*—Zandra Smith
*Assistant Examiner*—Telly D Green
(74) *Attorney, Agent, or Firm*—McKenna Long & Aldridge, LLP

(57) ABSTRACT

Disclosed are a CMOS image sensor capable of improving the focusing capability of light and a method for manufacturing the same. The CMOS image sensor includes a plurality of first micro-lenses formed in the upper part of the planarization layer, each of the first micro-lenses arranged over a corresponding photodiode, and a plurality of second micro-lenses formed on the planarization layer, each of the plurality of second micro-lenses wrapping a corresponding first micro-lens respectively.

14 Claims, 3 Drawing Sheets

US 7,491,993 B2

CMOS IMAGE SENSOR AND METHOD FOR MANUFACTURING THE SAME

CROSS REFERENCE TO RELATED APPLICATIONS

This application claims the benefit of the Korean Patent Application No. P2004-112028, filed on Dec. 24, 2004, which is hereby incorporated by reference as if fully set forth herein.

BACKGROUND OF THE INVENTION

1. Field of the Invention

The present invention relates to an image sensor, and more particularly, to a CMOS image sensor capable of maximizing the focusing efficiency of light and achieving an improvement in performance thereof, and a method for manufacturing the same.

2. Discussion of the Related Art

Image sensors are semiconductor devices for converting an optical image into an electric signal. Image sensors are basically classified into charge coupled devices (CCD) image sensors and complementary metal oxide semiconductor (CMOS) image sensors.

A CMOS image sensor includes a matrix of photodiodes that sense light irradiated thereto, and a CMOS logic circuit unit to convert the sensed light into electric signals for data collection. The greater the light reception of the photodiodes, the better the photo-sensitivity of the image sensor.

In order to enhance the photo-sensitivity of the image sensor, there have been efforts to increase the ratio of an area of the photodiodes to the entire area of the image sensor, i.e. to increase a fill factor. In another conventional technology, the paths of light rays incident on regions other than the photodiodes are changed, so that the light rays are focused onto the photodiodes.

A representative example of the focusing technology as stated above is forming convex micro-lenses by use of a high light-transmitting material. The micro-lenses are located over the photodiodes to refract the paths of incident light rays, thereby allowing a greater amount of light to reach the photodiodes.

The micro-lenses refract light rays running parallel to an optical axis of the micro-lens to a predetermined focal point on the optical axis.

A prior art CMOS image sensor is explained with reference to the accompanying drawings.

FIG. 1 is a sectional view illustrating the configuration of a prior art CMOS image sensor.

As shown in FIG. 1, the prior art CMOS image sensor includes: one or more photodiodes 11 formed on a semiconductor substrate (not shown) to produce electric charges based on the amount of incident light; an inter-insulation layer 12 formed on the overall surface of the semiconductor substrate including the photodiodes 11; a protective layer 13 formed on the inter-insulation layer 12; red, green, and blue color filter layers 14 arranged on the protective layer 13 side by side, each to transmit light of a particular wavelength; a planarization layer 15 formed on the color filter layers 14; and one or more convex micro-lenses 16 having a predetermined curvature, the micro-lenses being formed on the planarization layer 15 for focusing light of a particular wavelength onto the photodiodes 11 by transmitting the light through a corresponding one of the color filter layers 14.

Although not shown in the accompanying drawings, the inter-insulation layer 12 contains an optical shielding layer to prevent light from reaching regions other than the photodiodes 11.

Instead of the photodiodes, as can be easily expected, photo gates may be used as devices for sensing light.

In the prior art, the curvature and height of the micro-lenses 16 are determined in consideration of various factors, such as a focal point of the focused light. Mainly, the micro-lenses 16 are made of a polymer based resin, and are fabricated via deposition, patterning, and reflow processes.

Specifically, the micro-lenses 16 must have an optimal size, thickness, and radius of curvature, which are determined by the size, position, and shape of each unit pixel, the thickness of the light sensing device, and the height, position, and size of the light shielding layer.

The height and radius of curvature of the micro-lenses 16 are determined in consideration of various factors, such as a focal point of the focused light, as stated above. A photosensitive resist layer is typically used to form the micro-lenses 16. After coating the photosensitive resist layer, the photosensitive resist layer is selectively patterned via photo-exposure and development processes, to form a photosensitive resist pattern. Subsequently, the photosensitive resist pattern is subjected to a reflow process.

The profile of the photosensitive resist pattern varies in accordance with a photo-exposure condition including a focal point.

For example, a process performing condition varies in accordance with forming requirements of thin sub-layers, resulting in a variation in the profile of the micro-lens.

Consequently, in a process for manufacturing the prior art CMOS image sensor having the above-described configuration, the micro-lenses 16 provided to enhance the focusing power of light are an important factor for determining the property of the image sensor.

If natural light is irradiated, the micro-lenses 16 serve to focus a greater amount of light onto the photodiodes 11 as light of a particular wavelength is transmitted through a corresponding one of the color filter layers 14.

Specifically, if light reaches the image sensor, the incident light is collected by the micro-lenses 16, and subsequently, is filtered while passing through the color filter layers 14, so that it is finally focused onto the photodiodes 11 arranged beneath the color filter layers 14 in a one-to-one ratio.

The light shielding layer serves to prevent the incident light from running along paths other than the predetermined paths.

The prior art method for manufacturing the CMOS image sensor as stated above, however, has a problem in that the patterning condition of the photosensitive resist pattern is very unstable. This degrades the focusing efficiency of light, resulting in a reduction in the operational performance of the CMOS image sensor.

SUMMARY OF THE INVENTION

Accordingly, the present invention is directed to a CMOS image sensor and a method for manufacturing the same that substantially obviates one or more problems due to limitations and disadvantages of the related art.

An advantage of the present invention is that it can provide a CMOS image sensor and a method for manufacturing the same, which can achieve an improvement in the focusing capability of light via an improved curvature of micro-lenses.

Additional advantages and features of the invention will be set forth in part in the description which follows, and in part will become apparent may be learned by practice of the invention. These and other advantages of the invention may be realized and attained by the structure particularly pointed out in the written description and claims hereof as well as the appended drawings.

To achieve these and other advantages and in accordance with the purpose of the invention, as embodied and broadly described herein a CMOS image sensor comprises a semiconductor substrate, a plurality of photodiodes arranged on the semiconductor substrate with a predetermined distance therebetween, an inter-insulation layer formed on the overall surface of the semiconductor substrate including the photodiodes, a plurality of color filter layers arranged on the inter-insulation layer with a predetermined distance therebetween, a planarization layer formed on the overall surface of the semiconductor substrate including the color filter layers, a plurality of first micro-lenses formed in upper part of the planarization layer, each of the first micro-lenses arranged over a corresponding photodiode, respectively, and a plurality of second micro-lenses formed on the planarization layer, each of the plurality of second micro-lenses wrapping a corresponding first micro-lens respectively.

In another aspect of the present invention, a method for manufacturing a CMOS image sensor comprises the steps of forming an inter-insulation layer over a semiconductor substrate, forming a plurality of color filter layers on the inter-insulation to be arranged with a predetermined distance therebetween, forming a planarization layer on the overall surface of the semiconductor substrate including the color filter layers, forming a plurality of trenches having a predetermined depth in upper part of the planarization layer to correspond to the photodiodes in a one-to-one ratio, forming first micro-lenses in the trenches, respectively, and forming second micro-lenses on the planarization layer to wrap the first micro-lenses, respectively.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiment(s) of the invention and together with the description serve to explain the principle of the invention.

In the drawings.

DETAILED DESCRIPTION OF THE INVENTION

Reference will now be made in detail to exemplary embodiments of the present invention, examples of which are illustrated in the accompanying drawings. Wherever possible, the same reference numbers will be used throughout the drawings to refer to the same or like parts.

Figure 1:
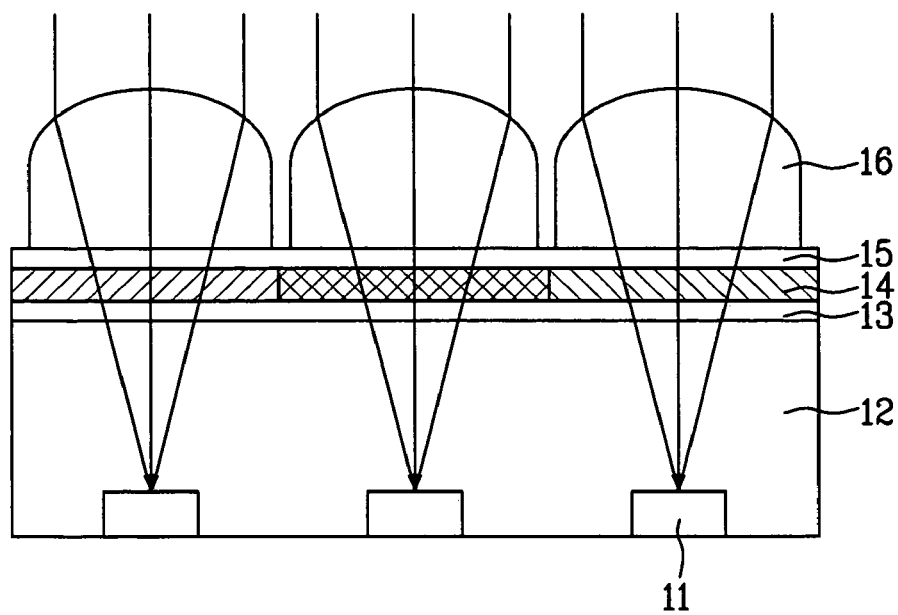
FIG. 1 is a sectional view illustrating the structure of a prior art CMOS image sensor.
Figure 2:
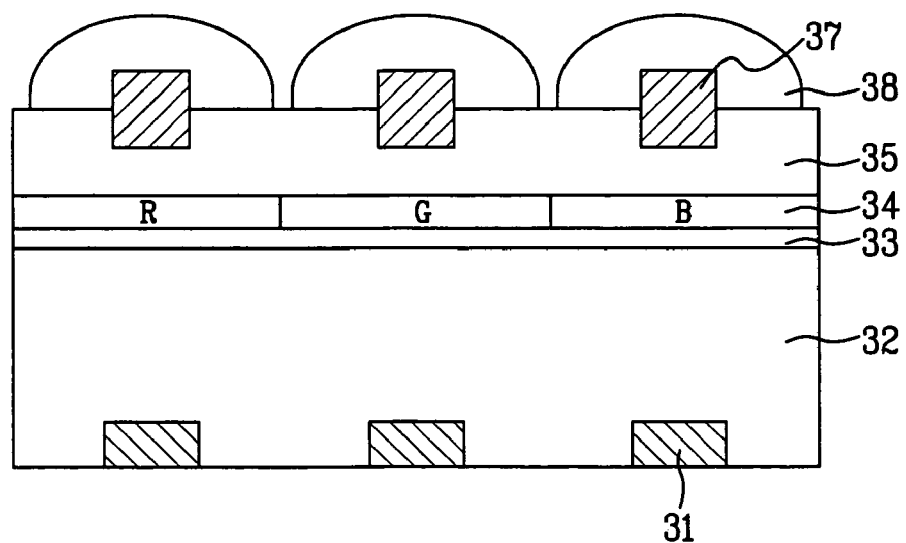
FIG. 2 is a sectional view illustrating the structure of a CMOS image sensor according to an exemplary embodiment of the present invention.

FIG. 2 is a sectional view illustrating the structure of a CMOS image sensor according to the present invention.

As shown in FIG. 2, the CMOS image sensor of the present invention includes: one or more photodiodes 31 formed on a semiconductor substrate (not shown) to produce electric charges based on the amount of incident light; an inter-insulation layer 32 formed on the overall surface of the semiconductor substrate including the photodiodes 31; a protective layer 33 formed on the inter-insulation layer 32; red, green, and blue color filter layers 34 formed on the protective layer 33, each arranged over a corresponding one of the photodiodes 31 for filtering light of a particular wavelength prior to transmitting the light to the respective photodiodes 31; a planarization layer 35 formed on the overall surface of the semiconductor substrate including the color filter layers 34; trenches 36 formed in the upper part of the planarization layer 35 to have a predetermined depth, each arranged over a corresponding one of the photodiodes 31; first micro-lenses 37 provided in the trenches 36, respectively; and second micro-lenses 38 configured to wrap the first micro-lenses 37, respectively, for focusing light in order to irradiate the focused light to the respective photodiodes 31.

The trenches 36 are arranged to the color filter layers 34 in a one-to-one ratio, and each trench 36 has a width narrower than that of a corresponding one of the color filter layer 34.

The first micro-lenses 37 are received in the trenches 36 so that an upper portion of each first micro-lens 37 protrudes out of the surface of the planarization layer 35.

The first and second micro-lenses 37 and 38 may be made of different materials, which may have different indexes of refraction from each other. For example, the first micro-lenses 37 may be made of silicon oxynitride (SiON) and the second micro-lenses 38 are made of photo-resist. Other exemplary materials that may be used for the first and second micro-lenses may include any transparent material such $SiO_2$ or additional photoresist materials that has different indexes of refraction from each other. In one exemplary embodiment the index of refraction of the first micro-lenses is smaller than the index or refraction of the second micro-lenses.

FIGS. 3A to 3D are sectional views illustrating sequential processes of a method for manufacturing the CMOS image sensor according to an exemplary embodiment of the present invention.

Figure 3A:
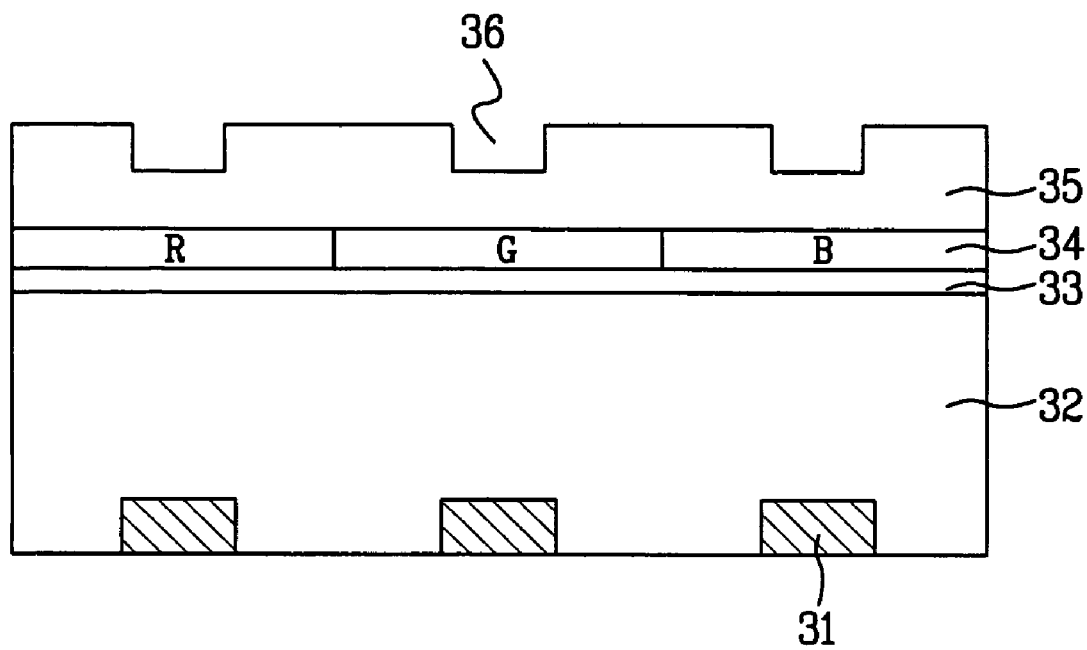
FIGS. 3A to 3D are sectional views illustrating sequential processes of a method for manufacturing the CMOS image sensor according to an exemplary embodiment of the present invention.

As shown in FIG. 3A, the one or more photodiodes 31 for producing electric charges based on the amount of incident light are formed on the semiconductor substrate (not shown). Subsequently, the inter-insulation layer 32 is formed on the overall surface of the semiconductor substrate including the photodiodes 31.

The inter-insulation layer 32 may have a multiple layer structure. Although not shown, after forming a single inter-insulation layer, a light shielding layer may be formed on the inter-insulation layer to prevent light from reaching regions other than the photodiodes 31, and subsequently, another inter-insulation layer may again be formed on the light shielding layer.

After forming the inter-insulation layer 32, the flat protective layer 33 for protecting a device from moisture and scratches is formed on the inter-insulation layer 32.

A dye-able resist layer is then coated and patterned on the protective layer 33, to form the color filter layers 34 each serving to filter light of a particular wavelength.

Subsequently, the flat planarization layer 35 is formed on the color filter layers 34. The planarization layer 35 serves to achieve a desired flatness of the resulting CMOS image sensor for the adjustment of a focal length and the formation of a lens layer.

Figure 3B:
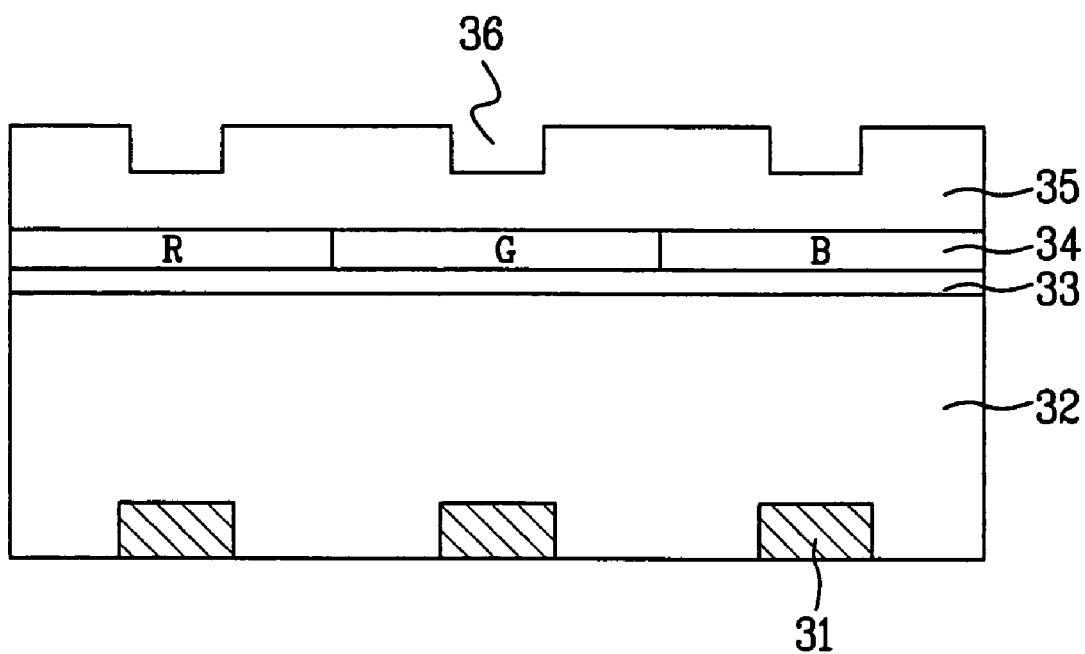

As shown in FIG. 3B, the planarization layer 35 is selectively ablated via photolithography and etching processes, so that a plurality of trenches 36 having a predetermined depth from the surface of the planarization layer 35 is formed to have a width smaller than that of a corresponding one of the color filter layers 34.

The plurality of trenches 36 is positioned to correspond to the photodiodes 31 in a one-to-one ratio.

Figure 3C:
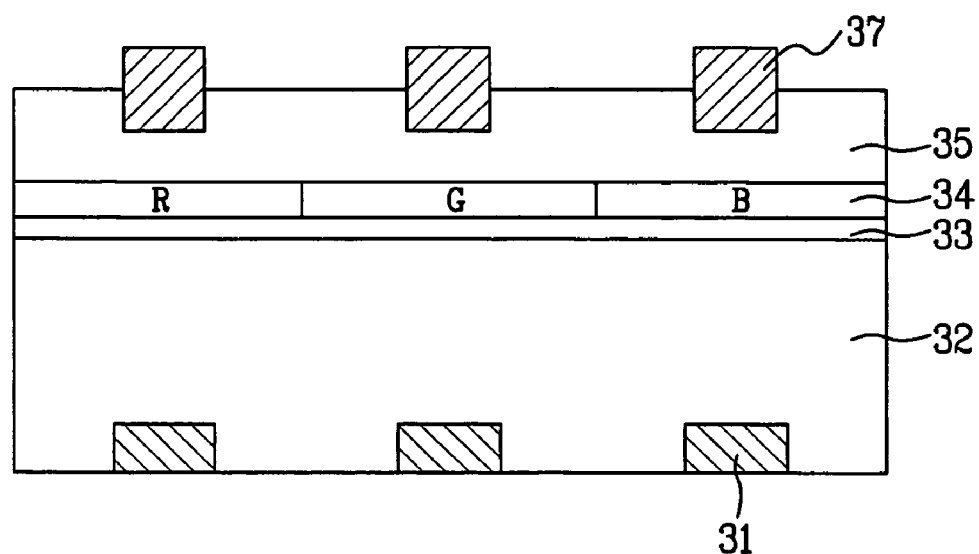

As shown in FIG. 3C, a micro-lens material layer is deposited on the overall surface of the semiconductor substrate including the trenches 36.

Subsequently, the micro-lens material layer is selectively patterned via photo-exposure and development processes, so that the first micro-lenses 37 are formed in the trenches 36 to correspond to the photodiodes 31 in a one-to-one ratio.

Specifically, the first micro-lenses 37 are received in the trenches 36 so that an upper portion of each micro-lens 37 protrudes out of the surface of the planarization layer 35.

Each of the first micro-lenses 37 may be positioned over a corresponding one of the color filter layers 34, and has a width narrower than that of the corresponding color filter layer 34.

Figure 3D:
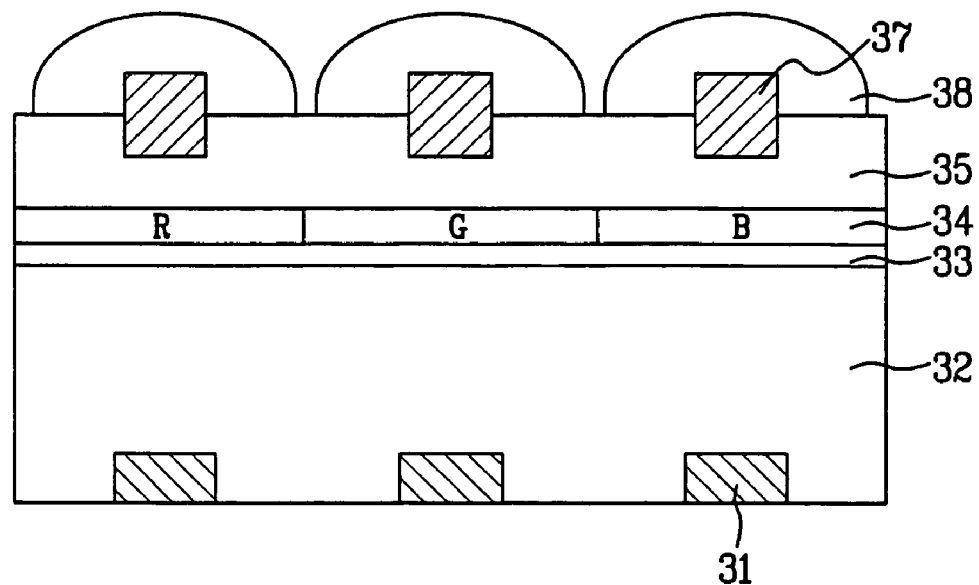

As shown in FIG. 3D, an additional micro-lens material layer is coated on the overall surface of the semiconductor device including the first micro-lenses 37.

The micro-lens material layer may be selected from among an oxide layer or resist layer.

As the micro-lens material layer is coated on the surface of the semiconductor device at regions where the first micro-lenses 37 are formed, specific regions of the micro-lens material layer corresponding to the first micro-lenses 37 are naturally protruded to form a plurality of rounded protuberances having a predetermined curvature. The micro-lens material may be coated by way of spin coating.

Subsequently, the micro-lens material layer may be patterned via photo-exposure and development processes, to form the second micro-lenses 38 that wrap the first micro-lenses 37, respectively.

To maintain the optimal radius of curvature of the completed second micro-lenses 38, the second micro-lenses 38 may be subjected to a thermal reflow process or an ultraviolet curing process.

It was found that by transmitting light through the second micro-lenses 38 and the first micro-lenses 37, the focusing power of light is increased, and the color filter layers 34 achieve an improved vividness.

If the micro-lenses are flawed after completing the thermal reflow process thereof, they must be reworked. Since the micro-lenses have a multilayer structure, the reworking of the micro-lenses can be simply performed without requiring the reworking of the color filter layers. This achieves a simplification in overall reworking process and thus, achieves a reduction in manufacturing costs.

As stated above, the first and second micro-lenses 37 and 38 may be made of different materials, which may have different indexes of refraction from each other.

As apparent from the above description, a CMOS image sensor and a method for manufacturing the same according to an exemplary embodiment of the present invention may have the following effects.

Firstly, in connection with the formation of second micro-lenses, the micro-lenses may naturally be profiled in a coating step to have a predetermined curvature. This has the effect of increasing the focusing efficiency of light.

Secondly, by virtue of such an increase in the focusing efficiency of light, a greater amount of light can be focused onto photodiodes after being transmitted through color filter layers. This enables the acquisition of more vivid colors.

Thirdly, the performance of the CMOS image sensor can be improved due to the acquired vivid colors.

Fourthly, first and second micro-lenses may be stacked one above another in double layers. With such configuration, the curvature of the micro-lenses can be improved, resulting in maximized focusing efficiency.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A CMOS image sensor comprising:
   a semiconductor substrate;
   a plurality of photodiodes arranged on the semiconductor substrate with a predetermined distance therebetween;
   an inter-insulation layer formed on the overall surface of the semiconductor substrate including the photodiodes;
   a plurality of color filter layers arranged on the inter-insulation layer with a predetermined distance therebetween;
   a planarization layer formed on the overall surface of the semiconductor substrate including the color filter layers;
   a plurality of first micro-lenses formed in upper part of the planarization layer, each of the first micro-lenses arranged over a corresponding photodiode, respectively; and
   a plurality of second micro-lenses formed on the planarization layer, each of the plurality of second micro-lenses wrapping a corresponding first micro-lens respectively.

2. The sensor as set forth in claim 1, wherein the first micro-lenses protrude from the surface of the planarization layer.

3. The sensor as set forth in claim 1, wherein each of the first micro-lenses has a width narrower than that of a corresponding color filter array.

4. The sensor as set forth in claim 1, wherein the first and second micro-lenses are made of different materials having different refraction indexes from each other.

5. The sensor as set forth in claim 4, wherein the first and second micro-lenses are made of SiON and photoresist respectively.

6. The sensor as set forth in claim 4, wherein the first and second micro-lenses are made of $SiO_2$ and photoresist respectively.

7. The sensor as set forth in claim 4, wherein the first and second micro-lenses are both photoresist materials, wherein the first micro-lens has an index of refraction that is smaller than the index of refraction of the second micro-lens.

8. A CMOS image sensor comprising:
   a plurality of first micro-lenses formed in upper part of the planarization layer, each of the first micro-lenses arranged over a corresponding photodiode; and
   a plurality of second micro-lenses formed on the planarization layer, each of the plurality of second micro-lenses wrapping a corresponding first micro-lens respectively;
   wherein the index of refraction of the first micro-lenses is smaller than the index of refraction of the second micro-lenses.

9. A method for manufacturing a CMOS image sensor comprising the steps of:
   forming an inter-insulation layer over a semiconductor substrate;
   forming a plurality of color filter layers on the inter-insulation to be arranged with a predetermined distance therebetween;

forming a planarization layer on the overall surface of the semiconductor substrate including the color filter layers;

forming a plurality of trenches having a predetermined depth in upper part of the planarization layer to correspond to the photodiodes in a one-to-one ratio;

forming first micro-lenses in the trenches, respectively; and forming second micro-lenses on the planarization layer to wrap the first micro-lenses, respectively.

10. The method as set forth in claim 9, wherein the first and second micro-lenses are made of different materials having different refraction indexes from each other.

11. The method as set forth in claim 9, wherein the step of forming the second micro-lenses comprises:

coating a lens forming material layer on the overall surface of the semiconductor substrate including the first micro-lenses; and selectively patterning the lens forming material layer.

12. The method as set forth in claim 11, wherein the step of forming the second micro-lenses further comprises performing a reflow process of the patterned lens-forming material layer.

13. The method as set forth in claim 9, further comprising the step of curing the second micro-lenses.

14. The method as set forth in claim 13, wherein the step of curing the second micro-lenses comprises irradiating ultraviolet rays onto the second micro-lenses.

\* \* \* \* \*